(12) United States Patent
Diawara et al.

(10) Patent No.: US 7,928,400 B1
(45) Date of Patent: Apr. 19, 2011

(54) X-RAY DETECTION SYSTEM FOR WAVELENGTH DISPERSIVE AND ENERGY DISPERSIVE SPECTROSCOPY AND ELECTRON BEAM APPLICATIONS

(75) Inventors: Yacouba Diawara, Madison, WI (US);
Roger D. Durst, Middleton, WI (US);
Sergei A. Medved, Madison, WI (US);
Vladislav N. Sedov, Fitchburg, WI (US);
Donald P. Lesher, Warren, OH (US)

(73) Assignee: Bruker AXS, Inc., Madison, WI (US)

( * ) Notice: Subject to any disclaimer, the term of this patent is extended or adjusted under 35 U.S.C. 154(b) by 438 days.

(21) Appl. No.: 12/185,565

(22) Filed: Aug. 4, 2008

(51) Int. Cl.
*H01L 27/146* (2006.01)
*H01L 31/09* (2006.01)

(52) U.S. Cl. .................. 250/370.09; 250/370.01; 378/5; 378/6

(58) Field of Classification Search .............. 250/361 R, 250/362, 363.01, 370.01, 370.09; 378/5, 378/6, 140, 161
See application file for complete search history.

(56) References Cited

U.S. PATENT DOCUMENTS

| | | | | |
|---|---|---|---|---|
| 4,535,245 | A * | 8/1985 | Zonneveld et al. | 250/385.1 |
| 5,345,083 | A * | 9/1994 | De Koning | 250/379 |
| 7,767,975 | B2 * | 8/2010 | Flamanc et al. | 250/370.11 |
| 2007/0272872 | A1 * | 11/2007 | Joshkin et al. | 250/370.11 |
| 2009/0140153 | A1 * | 6/2009 | Flamanc et al. | 250/368 |
| 2010/0102242 | A1 * | 4/2010 | Burr et al. | 250/370.11 |

OTHER PUBLICATIONS

Radeka, Veljko, "CCD and CMOS Imaging Devices for Large (Ground Based) Telescopes", Proceedings of the International Symposium on Detector Development for Particle, Astroparticle and Synchrotorn Radiation Experiments (SNIC 2006), Apr. 3-6, 206, Standord, California, US.

Ogasawara, et al., "The Effect of Depletion Layer Thickness in Avalanche Photodiodes for Measurement of Low-Energy Electrons", Nuclear Instruments and Methods in Physics Research, Secton A 566, 2006, pp. 575-583.

Kataoka, et al., "Performance of the Most Recent Avalanche Photodiodes for Future X-Ray and Gamma-Ray Astronomy", SPIE, 2004, vol. 5501, pp. 249-260.

Moszynski, et al., "Large Are Avalance photodiodes in Scintillation and X-Ray Detection", Nuclear Instrutments and Methods in Physics Research, Section A 485, 2002, pp. 504-521.

* cited by examiner

*Primary Examiner* — Bernard E Souw
(74) *Attorney, Agent, or Firm* — Law Offices of Paul E. Kudirka

(57) ABSTRACT

A detection system for wavelength-dispersive and energy-dispersive spectrometry comprises an X-ray detector formed from a solid-state avalanche photodiode with a thin entrance window electrode that permits the efficient detection of X-rays scattered from "light" elements. The detector can be tilted relative to the incident X-rays in order to increase the detection efficiency for X-rays scattered from "heavy" elements. The entrance window may be continuous conductive layer with a thickness in the range of 5 to 10 nanometers or may be a pattern of conductive lines with "windowless" areas between the lines. A signal processing circuit for the avalanche photodiode detector includes an ultra-low noise amplifier, a dual channel discriminator, a scaler and a digital counter. A linear array of avalanche photodiode detectors is used to increase the count rate of the detection system.

25 Claims, 4 Drawing Sheets

X-RAY DETECTION SYSTEM FOR WAVELENGTH DISPERSIVE AND ENERGY DISPERSIVE SPECTROSCOPY AND ELECTRON BEAM APPLICATIONS

BACKGROUND

Two conventional microanalysis techniques for determining elemental constituents in a specimen involve detecting characteristic X-rays that are produced by bombarding the specimen with high-energy electrons. Both techniques generate a spectrum in which peaks correspond to specific X-ray lines and from which the elements can be easily identified. In a first technique called "energy-dispersive spectroscopy" (EDS), the characteristic X-rays are detected with an energy-dispersive spectrometer, which is solid-state device that discriminates among X-ray energies to produce a complete spectrum. In a second technique, called "wavelength-dispersive spectroscopy" (WDS), the characteristic X-rays are detected with a crystal spectrometer that uses a diffracting crystal to select a wavelength of interest which is then detected. The complete spectrum is acquired sequentially as the full wavelength range is scanned.

Detectors for EDS consist of cooled Si(Li) detectors, HPGe detectors and, more recently, silicon drift detectors. However, all these detectors have limited count rates and dynamic ranges.

In WDS applications, for many decades, photomultiplier tube (PMT) and gas-filled proportional counters have been the preferred X-ray detectors; due to their acceptable quantum efficiency, adequate dead time, and good proportionality. In gas-filled detectors, various ionizing gases such as xenon, argon, neon, and P-10 are commonly used to provide the best elemental sensitivity and are contained in a closed detector housing having an entrance window to permit entry of the X-rays. These detectors have some drawbacks. In particular, elements whose atomic number is less than eleven are considered "light" in X-ray microanalysis. These light elements produce "soft" or low energy X-rays that are hard to detect because they are easily absorbed. Therefore, detectors for X-rays generated from light elements require thin and delicate windows to admit the X-rays without substantial absorption. These thin windows are commonly made of beryllium, Mylar, polypropylene and other materials where the materials and thicknesses are chosen to minimize the absorption of x-rays. Thin materials require precise techniques for gluing the window material to the detector housing in order to minimize the number of microscopic leaks that allow the ionizing gas to escape from the housing. Even with the best of such techniques, detectors employing ultra thin windows require a constant supply of ionizing gas due to leakage. Further, ultra thin windows can also break and require replacement.

In addition, gas proportional counters saturate between 75,000 to 125,000 counts per second. Any element with a short crystal-to-sample distance is prone to saturation if present in high concentrations. Some common examples are Al and Si on a TAP crystal; Ti, Cr, V, and Mn on a PET crystal; and Ni, Cu, Zn on a LiF crystal. The low saturation limit often requires the incident electron beam current to be increased in order to analyze trace elements more quickly and then reduced in order to prevent saturation. Automated systems which switch between high current and low current beam conditions can be used but require additional time to generate the X-ray spectrum. The same count rate limitation is observed also for x-ray fluorescence (element micro analysis) and in EDS.

SUMMARY

In accordance with the principles of the invention, a detection system for WDS and EDS comprises an X-ray detector formed from a solid-state avalanche photodiode. The X-ray detector has a thin entrance window electrode that permits the efficient detection of X-rays scattered from "light" elements and the detector can be tilted relative to the incident X-rays in order to increase the detection efficiency for X-rays scattered from "heavy" elements.

In one embodiment, a continuous entrance window on the X-ray detector is a conductive layer with a thickness in the range of 5 to 10 nanometers.

In another embodiment, the entrance window on the X-ray detector is a pattern of conductive lines with "windowless" areas between the lines.

In still another embodiment, a tilting mechanism automatically tilts the detector to an angle relative to the incoming X-rays for maximum detection efficiency.

In yet another embodiment, a signal processing circuit for the avalanche photodiode detector includes an ultra-low noise amplifier, a dual threshold discriminator, a scaler and a digital counter.

In a further embodiment, a signal processing circuit for the avalanche photodiode detector includes an ultra-low noise amplifier, a digital signal processing circuit and a digital counter.

In still another embodiment, a linear array of avalanche photodiode detectors is used to increase the count rate of the detection system.

DETAILED DESCRIPTION

In accordance with the principles of the invention, the detector element used in the present invention is an avalanche photodiode. Avalanche photodiodes are single photon counting photodetectors that can be regarded as semiconductor analogs to photomultipliers. When a high reverse bias voltage (typically 400-2000 volts in silicon depending on the photodiode structure) is applied to the diode, an avalanche photodiode exhibits an internal current gain effect (around 100) due to impact ionization (thereby producing an avalanche effect).

Some silicon avalanche photodiodes employ alternative doping and beveling techniques compared to traditional avalanche photodiodes that allow a higher voltage to be applied (>1500 volts) before breakdown occurs and accordingly a higher operating gain (>1000) to be achieved. In general, the higher the reverse voltage the higher the gain.

Avalanche photodiodes are conventional devices and are described in more detail in "The Effect of Depletion Layer Thickness in Avalanche Photodiodes for Measurement of Low-energy Electrons", K. Ogasawara, T. Takashimab, K. Asamurab, Y. Saitob, T. Mukaib, *Nuclear Instruments and Methods in Physics Research* A 566 pp. 575-583 (2006); "Performance of the Most Recent Avalanche Photodiodes for Future X-ray and Gamma-ray Astronomy", J. Kataoka, T. Ikagawa, Y. Yatsu, Y. Kuramoto, T. Saito, N. Kawai, Y. Serino, J. Kotoku, Y. Ishikawa, and N. Kawabatab, Tokyo Institute of Technology, Meguro, Tokyo, Japan, Hamamatsu Photonics K.K., Hamamatsu, Shizuoka, Japan and "Large Area Avalanche Photodiodes in Scintillation and X-ray Detection", M. Moszyinskia, M. Szawlowskib, M. Kapustaa, M. Balcerzyka, *Nuclear Instruments and Methods in Physics Research* A 485, pp. 504-521 (2002).

Figure 1:
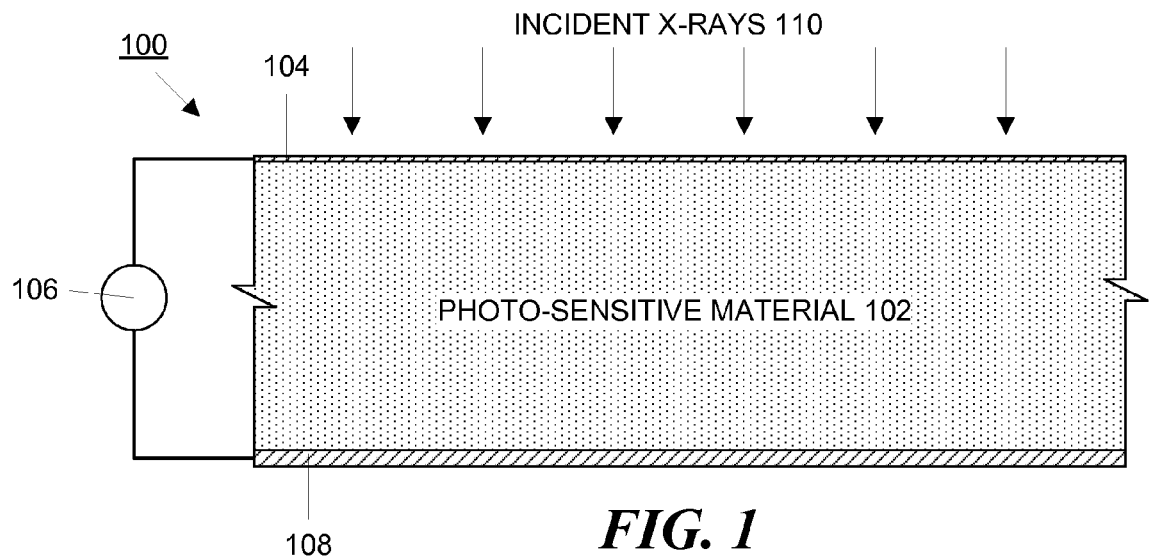
FIG. 1 is a cross-sectional schematic diagram of a first embodiment of an avalanche photodiode X-ray detector suitable for use with the present invention.

FIG. 1 shows a cross-sectional view of a first embodiment 100 of the avalanche photodiode detector. The figure is not drawn to scale and, as indicated, the photosensitive material 102 would typically be much thicker than the layers 104 or 108. The photosensitive material 102 used in the avalanche photodiode can be silicon, germanium, gallium arsenide, gallium nitride, HgCdTe or any other suitable semiconductor. The detector has a conventional configuration and includes an entrance window 104 at the semiconductor surface that maintains the entire entrance window surface at equal electric potential. This window could be a heavy doped semiconductor layer formed by ion implantation or by vapor depositing a polysilicon layer on the surface with conventional techniques or a conductive layer. A conductive charge collection electrode is fabricated on the opposite surface and a reverse bias voltage source 106 is connected between the entrance window and the charge collection electrode to complete the device. As previously mentioned, this bias source will have a voltage in the range of 400-2000 volts with a silicon semiconductor material and depending on the photodiode structure. The detector shown in FIG. 1 is typically cooled down to about −20° C. to reduce both the dark current and the noise.

Elements whose atomic number is less than eleven are considered "light" in X-ray microanalysis. These light elements produce "soft" or low energy X-rays that are hard to detect because only small numbers of photoelectrons are released when the X-rays enter the photosensitive material 102 and because the incident X-rays are absorbed by the entrance window material 104. In the embodiment shown in FIG. 1, in accordance with the principles of the invention, the entrance window 104 has an ultra thin (5 to 10 nanometers) thickness that allows X-rays with low energy to be transmitted to the photosensitive material 102. This allows "light" elements such as beryllium or lithium to be detected with good efficiency.

Figure 2A:
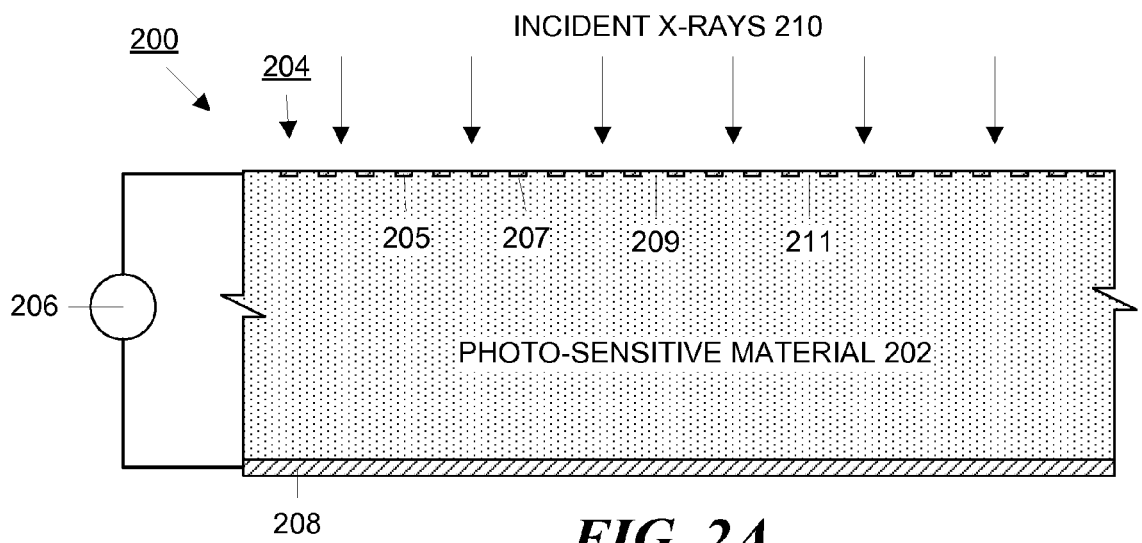
FIG. 2A is a cross-sectional schematic diagram of a second embodiment of an avalanche photodiode X-ray detector suitable for use with the present invention.
Figure 2B:
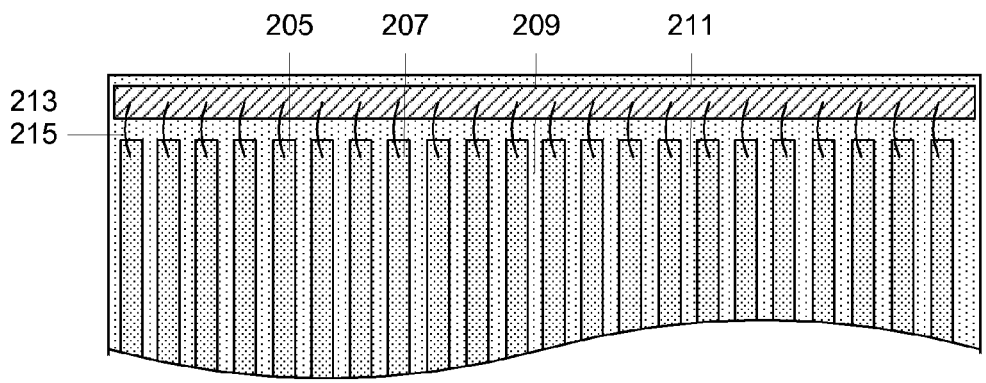
FIG. 2B is a top view of the avalanche photodiode X-ray detector shown in FIG. 2A illustrating the conductive lines that form the entrance window.

A second embodiment of the detector is illustrated in FIGS. 2A and 2B which show a cross-sectional view and top view of the detector, respectively. In FIG. 2, elements that correspond to those in FIG. 1 have been given corresponding numerals. For example, photosensitive material 202 in FIG. 2 corresponds to photosensitive material 102 in FIG. 1. In this embodiment, the entrance window 204 is formed by a pattern of conductive lines, such as lines 205 and 207, for example formed by a heavily doping the semiconductor material or by applying a conductor. The thickness of the layer is also ultra thin (5 to 10 nm). The photosensitive area between the lines, such as areas 209 and 211, is "windowless". The lines are connected to a conductive layer 213 by jumpers, such as jumper 215, so that the lines are held at equal potential. The conductive layer 213 is, in turn, connected to the reverse bias voltage source 206. The spaces between the lines are small compared to the detector thickness (for example, the detector thickness can be ten times the spacing between the lines) in such a way that the entrance window is held at substantially an equipotential voltage. This embodiment has an advantage over the embodiment shown in FIG. 1. In particular, the doped layer that forms the entrance window 104 in FIG. 1 constitutes a "dead" layer since the electric field in the layer is weak and electron transport is primarily by diffusion. The conductive lines 205, 207 eliminate the "dead" layer in at least fifty percent of the entrance window increasing the detection efficiency in this area.

Figure 3:
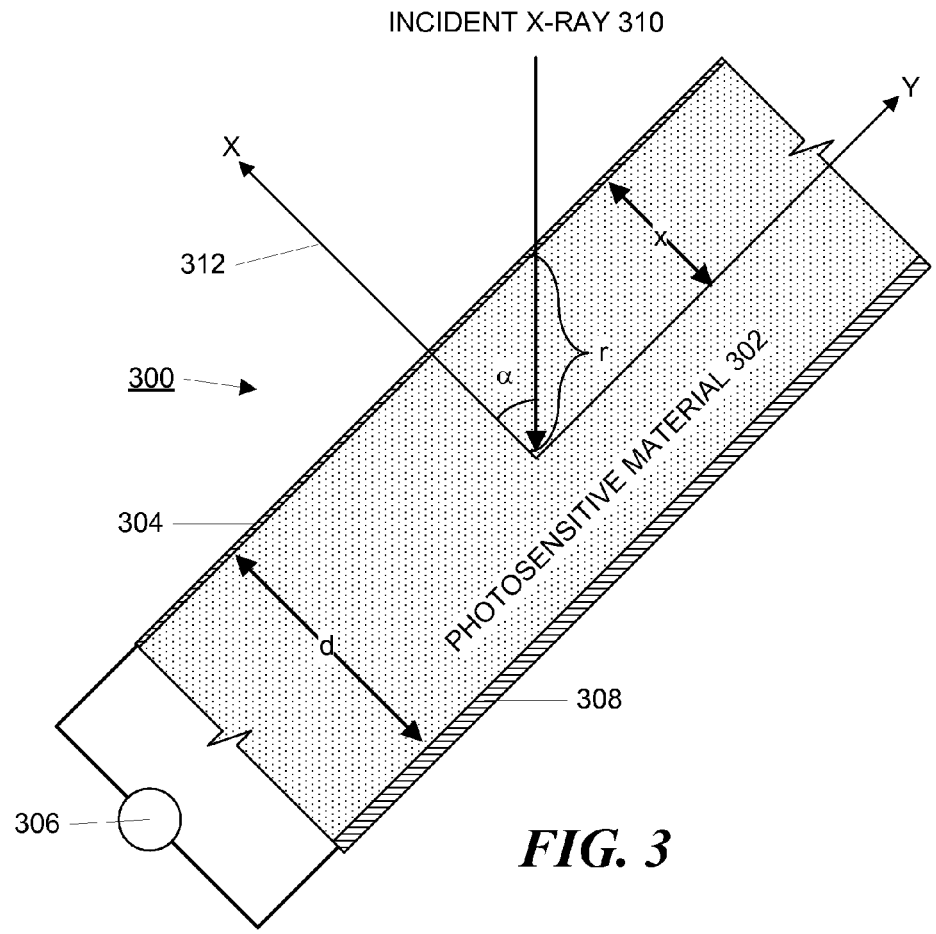
FIG. 3 is a cross-sectional schematic diagram of an embodiment of an avalanche photodiode X-ray detector illustrating how the detector can be tilted relative to the incoming X-ray radiation in order to improve detection efficiency for X-rays scattered from "heavy" elements.

In order to efficiently detect X-rays scattered from "heavy" elements, the detector shown in FIGS. 1 and 2A, 2B can be tilted relative to the incident X-rays as illustrated in FIG. 3. In FIG. 3, elements that correspond to those in FIGS. 1, 2A and 2B have been given corresponding numeral designations. A tilted detector 300 increases the absorption depth and therefore the quantum efficiency of the detector. When an X-ray 310 is incident on the detector 300 with an incident angle α relative to the surface normal 312 (here illustrated as the x-axis), the absorption length r varies according to the equation below:

$$r = \frac{x}{\sin(90° - \alpha)}$$

where x is the thickness of the photosensitive material to which the X-ray photon penetrates. Thus, the maximum absorption length is $$r_{MAX} = \frac{d}{\sin(90° - \alpha)}$$

where d is the thickness of the photosensitive material.

Therefore, by tilting the detector, the absorption length can be increased for detection of X-rays with higher energies. For example, X-rays arriving at a 60° incidence angle (α) will double the absorption length over X-rays arriving at 0°. Ultimately, heavy elements, such as uranium, can be detected by tilting the detector to produce a high incidence angle (89°<α<90° where the absorption length can exceed one centimeter.

Figure 4:
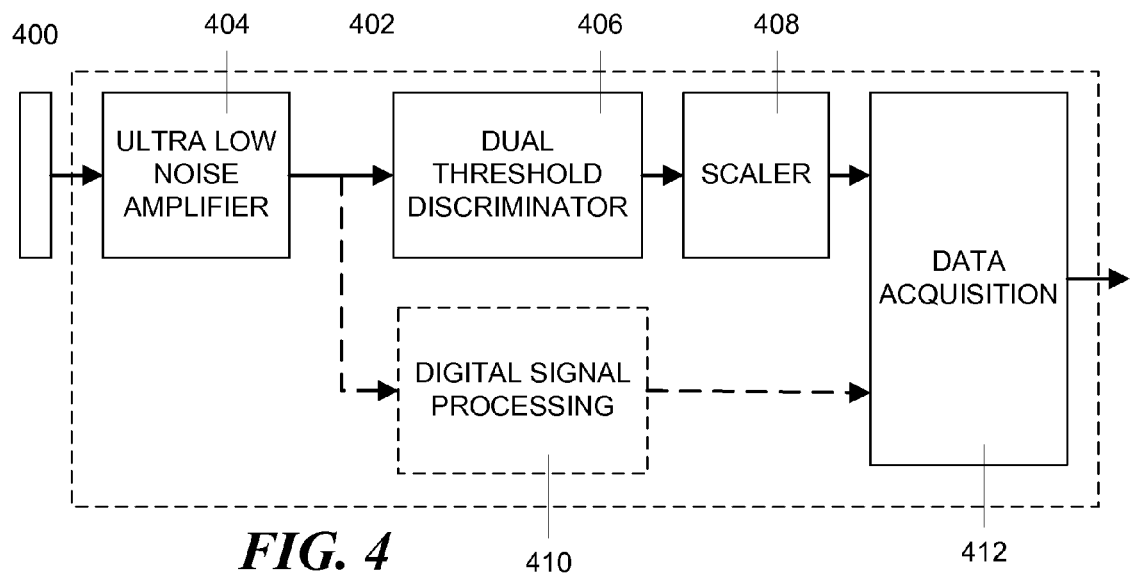
FIG. 4 is a block schematic diagram of apparatus for processing the signal generated by the X-ray detector.

With proper signal processing, the inventive detection system can achieve count rates that are substantially increased over conventional detectors. In particular, all detectors presently used in EDS and WDS applications operate at less than one million counts per second (cps). The inventive avalanche photodiode detectors operate up to 100 million cps with less than one nanosecond dead time. In order to process this signal, as indicated in FIG. 4, the avalanche photodiode 400 is connected to a processing circuit 402 that can process the high pulse count generated by the detector 400.

The processing circuit 402 includes an ultra-low noise analog amplifier 404. Amplifier 404 is a conventional amplifier that would typically include a pulse shaping circuit and a pile-up rejection circuit. The pulse shaping circuit is adjustable in order to optimize the shaping time. The shaping time must provide the best signal to noise ratio along with the required counting rates. For example, assuming randomly-spaced pulses, long-shaped pulses have a higher probability of "piling up" than short pulses. A pile-up rejection circuit is a well-known circuit that prevents electrical pulses generated by multiple X-rays from being processed within the time resolving capabilities of the electronics. When a pulse is being processed and another pulse arrives before the process is completed, both pulses are rejected and a correction is made to the live counting time. A pulse pile up rejection prevents pulses closely spaced in time from being measured as one pulse of twice the energy.

The analog signal at the amplifier output is applied to a dual threshold discriminator 406. The dual channel operation of the discriminator 406 allows a low level and a high level threshold to be set in order to reject noise, second harmonics, spectral artifacts and other undesired signals that reduce the peak signal to background signal ratio in a standard spectrometer. Typically, the amplifier 404 and the discriminator 406 are included in a single electronics package, such as a model NIM-NI568B manufactured and sold by Caen S.p.A., via Vetraia 11, 55049, Viareggio, Italy, which package is suitable for use with the present invention. The output of the discriminator 406 is provided to a conventional scaler 408 and the output of the scaler 408 is provided to a high-speed data acquisition circuit 412.

Alternatively, as shown in dotted lines, the output of amplifier 404 can be provided directly to digital signal processing circuit 410. The digital signal processing circuit 410 digitizes the output of the amplifier 404 and performs digital signal processing on the resulting data stream. Since pulses are resolved better in time and amplitude to give improved throughput, this method offers greater light sensitivity and lower limits of detectability. The output signal of circuit 410 is provided to the data acquisition circuit 412.

The electronics are chosen to have fast pulse processing capabilities in order to minimize quantitative dead time corrections and reduce the acquisition times for WDS quantitative analysis and X-ray mapping. Therefore, faster single scan X-ray maps will be possible for a larger variety of samples.

Figure 5:
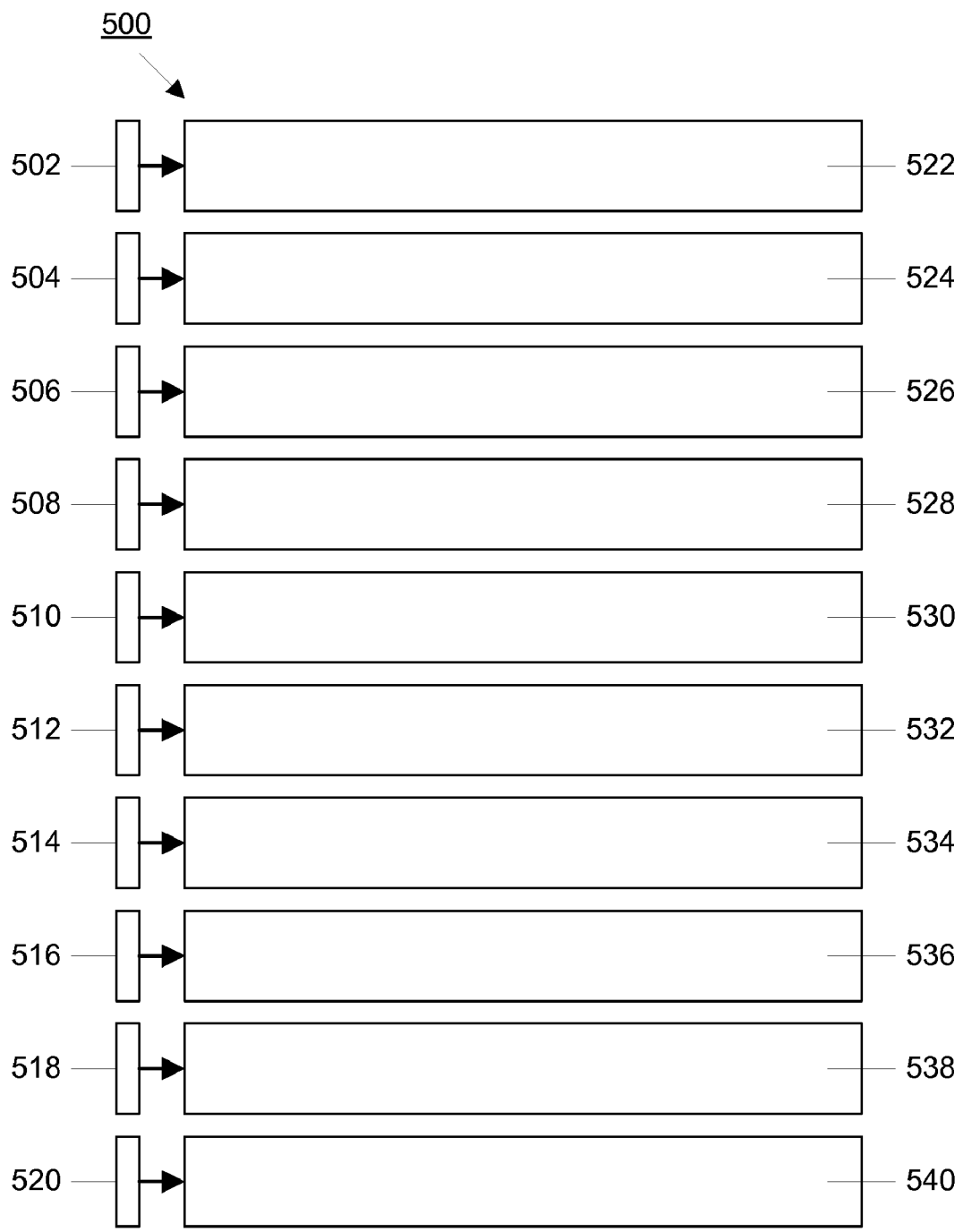
FIG. 5 is a schematic diagram of an array of detectors for improving the sensitive area and count rate capability of the detection apparatus.

As shown in FIG. 5, a linear array 500 of avalanche photodiodes (illustratively, ten avalanche photodiodes, 502-520) can be formed to increase the overall sensitive area of the detector and to extend the count rate capability of this embodiment to 1000 million counts per second. Each photodiode in the array is connected to a signal processing circuit (522-540) such as that shown in FIG. 4.

Figure 6:
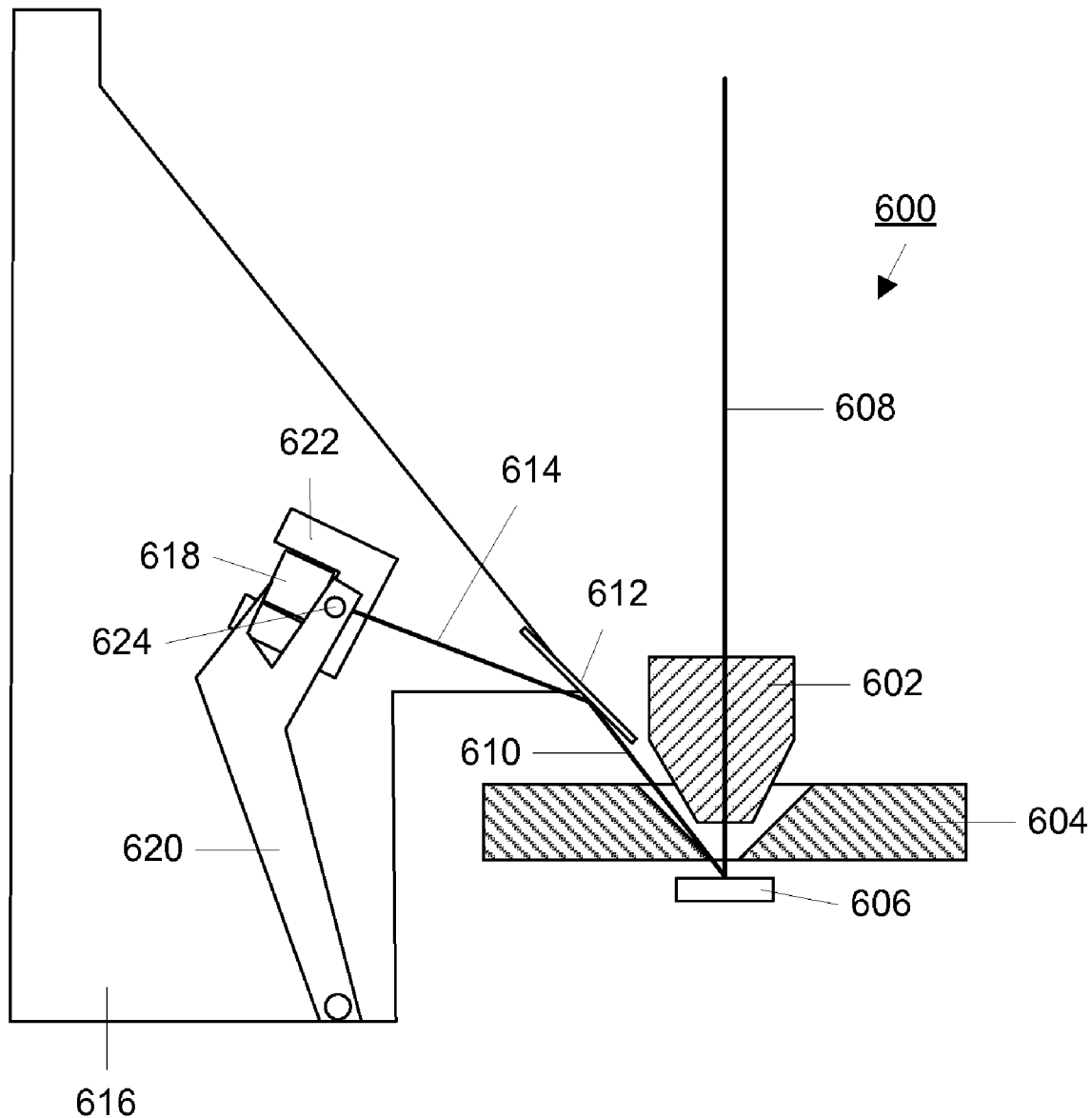
FIG. 6 is a block schematic diagram of a mechanism for automatically tilting an X-ray detector for detection of X-rays generated by "heavy" elements.

FIG. 6 illustrates an arrangement 600 that automatically tilts an avalanche photodiode X-ray detector in the manner described above in order to facilitate the detection of "heavy" elements. Illustratively, the arrangement 600 utilizes a wavelength-dispersive spectrometer 616, but the principles also apply to an energy-dispersive spectrometer. The spectrometer 616 is used in conjunction with a light microscope 602 which has an objective lens shown schematically as 604. In operation, an electron beam 608 strikes the sample under examination 606 and generates X-rays shown schematically as 610.

The X-rays 610 impinge on a crystal 612. The angle of crystal 612 relative to the incident X-rays is selected in a conventional fashion by the spectrometer 616 to select a wavelength of interest. X-rays with the selected wavelength 614 are directed to an avalanche photodiode detector 618 constructed in accordance with the principles of the invention as described above. The detector 618, in turn, is mounted on a movable arm 620 and in a rotatable stage 622, which may be a goniometer, which rotates about a fixed axis 624. The stage 622 allows the incidence angle of the X-rays 614 on the detector 618 to be varied from 0° to 90°. In an energy-dispersive spectrometer the X-rays 610 would directly impinge on the detector 618.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. Apparatus for detecting X-rays incident thereon, comprising:
   an avalanche photodiode detector having a slab of semiconductor material with a first face on which incident X-rays impinge and a second face on the opposite side of the slab from the first face, a conductive entrance window electrode with a thickness less than ten nanometers covering the first face and a conductive collection electrode covering the second face; and
   a voltage source that applies a reverse bias voltage across the entrance window electrode and the collection electrode.

2. The apparatus of claim 1 wherein the conductive entrance window electrode has a thickness in the range of five to ten nanometers.

3. The apparatus of claim 1 wherein the conductive entrance window electrode is continuous.

4. The apparatus of claim 1 wherein the conductive entrance window comprises a pattern of conductive lines wherein the semiconductor material is exposed between the lines.

5. The apparatus of claim 1 further comprising a mechanism that tilts the detector so that the entrance window electrode is at an angle relative to the incident X-rays in order to increase a detection efficiency for X-rays scattered from "heavy" elements.

6. The apparatus of claim 1 further comprising a signal processing circuit connected to the avalanche photodiode detector including an ultra-low noise amplifier, a dual channel discriminator, a scaler and a digital counter.

7. The apparatus of claim 1 further comprising a signal processing circuit connected to the avalanche photodiode detector including an ultra-low noise amplifier, a digital signal processing circuit and a digital counter.

8. The apparatus of claim 1 further comprising a linear array of avalanche photodiode detectors.

9. The apparatus of claim 1 wherein the semiconductor material is selected from the group consisting of silicon, germanium, gallium arsenide, gallium nitride and HgCdTe.

10. Apparatus for detecting X-rays incident thereon, comprising:
    an avalanche photodiode detector having a slab of semiconductor material with a first face on which incident X-rays impinge and a second face on the opposite side of the slab from the first face, a conductive entrance window electrode with a thickness less than ten nanometers covering the first face and a conductive collection electrode covering the second face;
    a voltage source that applies a reverse bias voltage across the entrance window electrode and the collection electrode;
    a mechanism that tilts the detector so that the entrance window electrode is at an angle relative to the incident X-rays in order to increase a detection efficiency for X-rays scattered from "heavy" elements; and a signal processing circuit connected to the avalanche photodiode detector including an ultra-low noise amplifier, a dual channel discriminator, a scaler and a digital counter.

11. The apparatus of claim 10 wherein the conductive entrance window electrode has a thickness in the range of five to ten nanometers.

12. The apparatus of claim 10 wherein the conductive entrance window electrode is continuous.

13. The apparatus of claim 10 wherein the conductive entrance window comprises a pattern of conductive lines wherein the semiconductor material is exposed between the lines.

14. The apparatus of claim 10 further comprising a linear array of avalanche photodiode detectors.

15. A wavelength-dispersive spectrometer for measuring X-rays generated when an electron beam strikes a sample, the spectrometer comprising:
   an X-ray detector;
   a crystal; and
   a spectrometer mechanism that positions the crystal relative to the generated X-rays so that X-rays with a selected wavelength are incident on the X-ray detector, wherein the X-ray detector is an avalanche photodiode detector having a slab of semiconductor material with a first face on which incident X-rays impinge and a second face on the opposite side of the slab from the first face, a conductive entrance window electrode with a thickness less than ten nanometers covering the first face and a conductive collection electrode covering the second face.

16. The spectrometer of claim 15 wherein the conductive entrance window electrode has a thickness in the range of five to ten nanometers.

17. The spectrometer of claim 15 wherein the conductive entrance window electrode is continuous.

18. The spectrometer of claim 15 wherein the conductive entrance window comprises a pattern of conductive lines wherein the semiconductor material is exposed between the lines.

19. The spectrometer of claim 15 further comprising a mechanism that tilts the detector so that the entrance window electrode is at an angle relative to the incident X-rays in order to increase a detection efficiency for X-rays scattered from "heavy" elements.

20. An energy-dispersive spectrometer for measuring X-rays generated when an electron beam strikes a sample, the spectrometer comprising:
   an avalanche photodiode detector having a slab of semiconductor material with a first face on which incident X-rays impinge and a second face on the opposite side of the slab from the first face, a conductive entrance window electrode with a thickness less than ten nanometers covering the first face and a conductive collection electrode covering the second face; and
   a counter circuit for processing a signal generated by the detector to generate an X-ray spectrum.

21. The spectrometer of claim 20 wherein the conductive entrance window electrode has a thickness in the range of five to ten nanometers.

22. The spectrometer of claim 20 wherein the conductive entrance window electrode is continuous.

23. The spectrometer of claim 20 wherein the conductive entrance window comprises a pattern of conductive lines wherein the semiconductor material is exposed between the lines.

24. The spectrometer of claim 20 wherein the counter circuit comprises a signal processing circuit connected to the avalanche photodiode detector including an ultra-low noise amplifier, a dual channel discriminator, a scaler and a digital counter.

25. The spectrometer of claim 20 wherein the counter circuit comprises a signal processing circuit connected to the avalanche photodiode detector including an ultra-low noise amplifier, a digital signal processing circuit and a digital counter.

* * * * *